(12) United States Patent
Trautmann et al.

(10) Patent No.: US 11,921,070 B2
(45) Date of Patent: Mar. 5, 2024

(54) PROCESSES, APPARATUSES AND SYSTEM FOR MEASURING A MEASURED VARIABLE

(71) Applicant: Carl Zeiss AG, Oberkochen (DE)

(72) Inventors: Nils Trautmann, Aalen (DE); Ulrich Vogl, Aalen (DE); Jörg Wrachtrup, Stuttgart (DE); Rainer Stöhr, Stuttgart (DE)

(73) Assignee: Carl Zeiss AG, Oberkochen (DE)

( * ) Notice: Subject to any disclaimer, the term of this patent is extended or adjusted under 35 U.S.C. 154(b) by 181 days.

(21) Appl. No.: 17/771,308

(22) PCT Filed: Oct. 19, 2020

(86) PCT No.: PCT/EP2020/079366
§ 371 (c)(1),
(2) Date: Apr. 22, 2022

(87) PCT Pub. No.: WO2021/078684
PCT Pub. Date: Apr. 29, 2021

(65) Prior Publication Data
US 2022/0365012 A1    Nov. 17, 2022

(30) Foreign Application Priority Data

Oct. 25, 2019  (DE) .......................... 102019128932.7

(51) Int. Cl.
*G01V 3/00* (2006.01)
*G01N 21/64* (2006.01)
(Continued)

(52) U.S. Cl.
CPC ......... *G01N 24/10* (2013.01); *G01N 21/6408* (2013.01); *G01R 33/0041* (2013.01);
(Continued)

(58) Field of Classification Search
CPC .............. G01R 33/543; G01R 33/5659; G01R 33/3415; G01R 33/36; A61B 5/055
(Continued)

(56) References Cited

U.S. PATENT DOCUMENTS

2016/0161429 A1    6/2016  Englund et al.
2017/0146615 A1    5/2017  Wolf et al.
(Continued)

FOREIGN PATENT DOCUMENTS

CN    105444749 A    2/2018
CN    108254591 A    7/2018
(Continued)

OTHER PUBLICATIONS

International Search Report from corresponding International Patent Application No. PCT/EP20/79366, dated Feb. 15, 2021.
(Continued)

*Primary Examiner* — Walter L Lindsay, Jr.
*Assistant Examiner* — Frederick Wenderoth
(74) *Attorney, Agent, or Firm* — KUSNER & JAFFE

(57) ABSTRACT

It is an object of the invention to improve processes, apparatuses and systems for measuring a measured variable. To this end, a measured variable is measured in a measuring process on the basis of an NV center as a quantum sensor. The NV center has a plurality of quantum states and is optically excitable on the basis of an occupancy of one of the quantum states into at least one excited state of the quantum states by means of an excitation light. The at least one excited state can decay at least with emission of emission light of the NV center. In the measuring process, the NV center is irradiated by the excitation light, the excitation light having a time periodic modulation, and a respective occupancy probability and/or a respective lifetime of the quantum states depending on the measured variable and the
(Continued)

excitation light. A phase shift is determined between the emission light of the NV center and the modulation of the excitation light and a measurement value for the measured variable is determined on the basis thereof.

18 Claims, 5 Drawing Sheets

(51) Int. Cl.
    *G01N 24/10*     (2006.01)
    *G01R 33/00*     (2006.01)
    *G01R 33/26*     (2006.01)
    *G01R 33/60*     (2006.01)

(52) U.S. Cl.
    CPC ............. *G01R 33/26* (2013.01); *G01R 33/60* (2013.01); *G01N 2201/0697* (2013.01)

(58) Field of Classification Search
    USPC .......................................................... 324/304
    See application file for complete search history.

(56) References Cited

U.S. PATENT DOCUMENTS

| | | | |
|---|---|---|---|
| 2017/0212181 A1 | 7/2017 | Coar et al. | |
| 2017/0363696 A1 | 12/2017 | Hahn et al. | |
| 2019/0219527 A1 | 7/2019 | Kim et al. | |
| 2019/0239753 A1 | 8/2019 | Wentz | |
| 2021/0405129 A1 | 12/2021 | Meijer et al. | |

FOREIGN PATENT DOCUMENTS

| | | | |
|---|---|---|---|
| DE | 102018127394 A1 | 5/2020 | |
| GB | 2578799 A | 5/2020 | |
| WO | WO2019/014198 A2 | 1/2019 | |
| WO | WO2020/046860 A1 | 3/2020 | |
| WO | WO-2021078684 A1 * | 4/2021 | ......... G01N 21/6408 |

OTHER PUBLICATIONS

Acosta V M et al: "Optical properties of the nitrogen-vacancy singlet levels in diamond", Physical Review B, Bd. 82, Nr. 20, 2010, XP055105036, ISSN: 1098-0121, DOI: 10.1103/PhysRevB.82. 201202.

Neumann P et al: "Excited-state spectroscopy of single NV defect in diamond using optically detected magnetic resonance", New Journal of Physics, GB, Bd. 11, Nr. 1, (2009), XP020154302, ISSN: 1367-2630.

Lambe J & Compton W D: "Luminescence and Symmetry Properties of Color Centers", Physical Review 106(4), 1957, XP055759390.

German Search Report (with English translation) dated Sep. 29, 2020 from corresponding German Priority Patent Appl. No. DE 10 2019 128 932.7.

* cited by examiner

PROCESSES, APPARATUSES AND SYSTEM FOR MEASURING A MEASURED VARIABLE

This application is a national stage application, filed under 35 U.S.C. § 371, of International Patent Application No. PCT/EP2020/079366, filed Oct. 19, 2020, which claims priority to DE 10 2019 128 932.7, filed Oct. 25, 2019, each of which is incorporated by reference herein in its entirety

FIELD OF THE INVENTION

The invention lies in the field of metrology and relates in particular to a measuring method for measuring a measured variable on the basis of an NV center, to an apparatus for measuring a measured variable, to a measuring head for the measurement of a measured variable, and also to a system for detecting a nerve cell activity.

BACKGROUND OF THE INVENTION

Usually in metrology, for a measured variable, a value thereof, i.e. for instance a measured value, is captured on the basis of a macroscopic measurement. In this regard, for instance, a magnetic field can be measured on the basis of induction of an electric current, wherein the induced current is dependent on a change in the magnetic field.

For the purpose of optical measurement it is possible—depending on the measured variable—to use for instance conventional fluorescent substances such as molecules that fluoresce upon excitation. Moreover, various materials are used whose optical properties are dependent on the respective measured variable, wherein a (measured) value of such an optical property or a change therein is captured optically—for instance electro-optically—and a measured value of the measured variable is determined from the (measured) value of the optical property on the basis of the dependence of said optical property on the measured variable.

Besides macroscopic measurement techniques, increasingly measurement techniques based on quantum sensor technology are finding application. In this regard, for instance, nanodiamonds (or more generally mesoscopic solid-state elements) having nitrogen-vacancy centers as color centers, upon optical excitation, have a high brightness, i.e. in particular a high light emission, and also photostability, i.e. in particular a low degree of bleaching. Moreover, an emission light emitted by such a nitrogen-vacancy center is dependent on a magnetic field effective there and also on further influencing factors such as, for instance, a microwave radiation, the dependencies being determined quantum-mechanically, whereby a high measurement accuracy and measurement reproducibility can be achieved—even at room temperature. Proceeding from a magnetic field dependence of fluorescence or phosphorescence (or more generally luminescence, hereinafter referred to in summary for short as "fluorescence" and corresponding to fluorescence substance or fluorophore) of nitrogen-vacancy centers or more generally of NV centers, a magnetic field effective in the case of an NV center can be determined by way of a change in an intensity of the fluorescence.

There is a need to improve methods, apparatuses and systems for measuring a measured variable and also in particular to increase the measurement accuracy and/or the reproducibility of such a measurement, to reduce influencing by the measurement and/or to make such a measurement more reliable and/or more efficient.

SUMMARY OF THE INVENTION

The invention satisfies this need in each case by means of a measuring method for measuring a measured variable on the basis of an NV center, by means of an apparatus for measuring a measured variable, by means of a measuring head for a measurement of a measured variable, and also by means of a system for detecting a nerve cell activity in each case in accordance with the teaching of one of the main claims. The dependent claims relate in particular to advantageous embodiments, developments and variants of the present invention.

A first aspect of the invention relates to a measuring method for measuring a measured variable on the basis of an NV center. The NV center has a plurality of quantum states and is optically excitable into at least one excited state of the quantum states by means of an excitation light depending on an occupation of one of the quantum states. In this case, the at least one excited state can decay at least with emission of emission light of the NV center. The measuring method comprises irradiating the NV center with the excitation light, wherein the excitation light has a temporally periodic modulation and wherein a respective occupation probability and/or a respective lifetime of the quantum states are/is dependent on the measured variable and the excitation light. The measuring method furthermore comprises determining a phase shift between the emission light of the NV center and the modulation of the excitation light. Moreover, the measuring method comprises determining a measured value for the measured variable on the basis of the phase shift.

Within the meaning of the disclosure, an "NV center" should be understood to mean at least one color center, wherein the color center is optically excitable by means of an excitation light depending on a magnetic field effective at said color center or depending on some other measured variable and emission light is emittable by the excited color center. Such a color center can be a defect in a matrix structure, in particular in a (possibly crystalline) solid body. Moreover, an intensity of the emission light can be dependent on a resonant microwave absorption, wherein the resonant microwave absorption is dependent on the magnetic field and/or the other measured variable at the color center. Moreover, such an NV center can be a nitrogen-vacancy center in a diamond lattice, for instance a so-called $[NV]^-$ center, which is the subject of current research. In the case of such an $[NV]^-$ center, at the present time a model takes as a basis a multi-electron system described as a three-level system having a triplet ground state and an excited triplet state and also at least one intermediate state lying energetically between the ground state and the excited state—in particular a singlet state—(or for instance two intermediate states in accordance with Doherty, Marcus W.; Manson, Neil B.; Delaney, Paul; Jelezko, Fedor; Wrachtrup, Jörg; Hollenberg, Lloyd C. L. (Jul. 1, 2013). "The nitrogen-vacancy colour center in diamond". Physics Reports. The nitrogen-vacancy colour center in diamond. 528 (1): 1-45). Moreover, in the case of such an $[NV]^-$ center, an electron spin resonance can be excited between a plurality of energetically different states in the triplet ground state which differ energetically on account of a spin interaction and also a magnetic field possibly acting at the NV center. Microwave radiation of suitable frequency can be used for exciting the electron spin resonance, such that by means of an energy from the microwave radiation the electron system is raised from an energetically lower state of the triplet ground state into an energetically higher state of the triplet ground state.

One advantage of the dependence of the lifetime and/or of the occupation probability of at least some of the quantum states on the measured variable may reside in particular in the fact that this enables the NV center to be used as a quantum sensor for measuring the measured variable. In this case, in addition to the dependence on the measured variable or as an alternative to the dependence on the measured variable, some of the quantum states can also be able to be manipulated by the excitation light, whereby the state—i.e. in particular the occupation probabilities for specific quantum states—can advantageously be influenced by means of the excitation light in such a way that the dependence on the measured variable is increased. One advantage of an NV center as quantum sensor may reside in particular in the fact that the properties thereof are determined quantum-mechanically, whereby a high measurement accuracy, measurement reproducibility and/or sensitivity can be achieved. Such a quantum sensor makes it possible to reduce influencing of the measured variable to be measured by the measuring method or by a corresponding (measuring) apparatus—for instance in comparison with a macroscopic measurement in which possibly an object to be examined and/or a measured variable to be measured with regard to this object interact(s) with a macroscopic sensor.

One advantage of determining the phase shift and the measured value based thereon may reside in particular in the fact that the phase shift is insensitive vis-à-vis (brightness/intensity) fluctuations of the fluorescence—for instance on account of (random) fluctuations of the excitation light—and/or disturbances and/or noise influence(s) the phase shift less than the intensity of the fluorescence (and thus a measurement based on a determination of the intensity), whereby advantageously the measuring can be made more reliable and/or a measurement accuracy can be increased and/or a signal-to-noise ratio and thus a sensitivity can be increased.

One advantage of the modulation of the excitation light may reside in particular in the fact that—for instance compared with a pulsed excitation light which at least substantially either has a full intensity or is off—for modulation purposes a (comparatively) smaller and/or continuous change in the excitation light is sufficient, whereby advantageously the measuring method can be carried out more simply and/or a corresponding (measuring) apparatus can be embodied more simply and thus be made more reliable. Moreover, by means of the modulation it is possible to reduce an intensity of the excitation light, in particular a maximum intensity and/or a change in the intensity, and thus to reduce influencing and/or (measurement) errors—for instance on account of nonlinear effects.

By virtue of the measuring on the basis of the excitation light and the emission light—i.e. for instance an optical measurement—it is possible to determine the measured value without physical contact—for instance between a control device, a light source and/or a sensor device and an object to be examined.

In some embodiments, a diamond has a nitrogen-vacancy center as the NV center. In some variants thereof, a mesoscopic solid-state element comprises the diamond. Moreover, in some variants, the diamond is embodied as a mesoscopic solid-state element, for instance as a nanodiamond. In some further variants, the diamond is embodied as a macroscopic solid-state element, for instance as a macroscopic monocrystalline or polycrystalline diamond, for instance as a diamond platelet or rod-shaped diamond and/or for instance having an extent along one axis of at least 100 micrometers or for instance having a weight of at least 10 mg.

One advantage of the nitrogen-vacancy center may reside in particular in the fact that the—in particular quantum-mechanical—properties thereof regarding fluorescence—for instance if it is embodied in a (nano)diamond—are stable even at room temperature (i.e. for instance in a temperature range around 20° C., for instance between 200 K and 500 K), thereby enabling measurements over a large temperature range and/or at customary temperatures—for instance in production methods, in the industrial sphere and/or in the medical sphere such as in the case of surgery, for instance.

Within the meaning of the disclosure, a "mesoscopic solid-state element" should be understood to mean at least one object composed of a solid-state material which has a spatial extent—i.e. for instance a maximum diameter—of less than 1 µm. Moreover, the spatial extent can be greater than approximately 1 nm. Such a mesoscopic solid-state element can be a matrix structure composed of atoms or molecules, i.e. for instance a crystalline solid body. In the case of an NV center of a mesoscopic solid-state element, the mesoscopic solid-state element for instance comprises or forms at least said NV center. In this case, the NV center can be a defect in a matrix structure of the mesoscopic solid-state element. Moreover, the mesoscopic solid-state element can comprise further NV centers. Such a mesoscopic solid-state element can be or comprise a nanodiamond, for instance. In this case, such a nanodiamond can comprise as NV center a nitrogen-vacancy center, i.e. for instance an $[NV]^-$ center or an $[NV]^0$ center. Moreover, such a nanodiamond can comprise as NV center an ST1 or "Stuttgart 1" color center. Moreover, (more generally) a mesoscopic diamond matrix can be such a mesoscopic solid-state element and comprise as NV center a color center in the diamond matrix. Moreover, such a mesoscopic solid-state element can be produced for instance from 4H SiC and comprise for instance a solid-state matrix, in particular a crystal lattice, composed of 4H SiC. In this case, such a mesoscopic solid-state element composed of 4H SiC can comprise as NV center a color center such as, for instance, a so-called "VcVsi DiVacancy" or a so-called "NV Nitrogen Vacancy" or a so-called "hexagonal lattice site silicon vacancy $(V_{Si})$" (see, for instance, NATURE COMMUNICATIONS | (2019) 10:1954 | https://doi.org/10.1038/s41467-019-09873 | High-fidelity spin and optical control of single silicon-vacancy centres in silicon carbide), in particular in the crystal lattice.

One advantage of the mesoscopic solid-state element which comprises the NV center—i.e. embodied for instance as a defect in a solid-state matrix of the mesoscopic solid-state element such as a diamond matrix, for instance—may reside in particular in the fact that the NV center has a high photostability and/or a high brightness—i.e. in particular a high intensity of the emission light for a specific intensity of the excitation light—and/or the mesoscopic solid-state element shields the NV center from external influences—for instance shields it to a greater extent than in the case of conventional fluorophores such as individual fluorescent molecules—, whereby the efficiency and/or reliability can be increased and their application can be simplified. Moreover, such mesoscopic solid-state elements usually interact less with a—for example biological—material and thus have an increased (bio)compatibility, as a result of which advantageously (unwanted) influencing of a material to be examined—for instance tissue—can be reduced and the application—for instance in the case of surgery—can thus be simplified. Moreover, an increased (bio)compatibility can enable longer measurement times and thus for instance an increased accuracy and/or reliability. Moreover, other applications—i.e. in particular not in the case of a biological material—can thus be improved, wherein it is possible to examine for instance specific (pro)portions of a product such as, for instance, a chemical substance or a workpiece by means of such NV centers as quantum sensors—i.e. to determine for instance a material property by determining a measured variable with regard to the material property.

A second aspect of the invention relates to an apparatus for measuring a measured variable. The apparatus comprises a spatial region for arranging one or more NV centers. In addition, the apparatus comprises a light source for irradiating the spatial region with an excitation light which has a temporally periodic modulation and by means of which, when the one or more NV centers are arranged within the spatial region, one or more of the NV centers are optically excitable. In addition, the apparatus comprises a sensor device configured to capture an emission light emitted by one or more of the NV centers. Furthermore, the apparatus comprises a control device configured to cause the light source to irradiate at least one of the NV centers with the temporally periodic modulated excitation light and, on the basis of the emission light captured by the sensor device, to determine a phase shift between the emission light and the modulation of the excitation light and also, on the basis thereof, to determine a measured value for the measured variable in the case of the at least one NV center.

The possible advantages, embodiments or variants of the first aspect of the invention are correspondingly also applicable to the apparatus for measuring a measured variable. In this case, the apparatus can be configured for instance to carry out a method in accordance with the first aspect of the invention. An apparatus for measuring a measured variable may also be called "measuring apparatus".

A third aspect of the invention relates to a measuring head for a measurement of a measured variable. The measuring head comprises a housing, an NV center, a light source or an optical coupling element and also a sensor device or a—possibly further—optical coupling element. In some variants with a light source, the light source is configured to irradiate the NV center with an excitation light generated by the light source. As an alternative thereto, in some variants—for instance in some variants without a light source for excitation light—an optical coupling element of the measuring head, which element is connectable to a light guide arranged outside the housing, is configured to irradiate the NV center with an excitation light radiated in via the light guide. In some variants with a sensor device, the sensor device is configured to capture an emission light emitted by the NV center. As an alternative thereto, in some variants—for instance in some variants without a sensor device for capturing the emission light—an optical coupling element of the measuring head is configured to guide the emission light emitted by the NV center to a light guide arranged outside the housing. Moreover, the NV center and also possibly the sensor device and/or possibly the light source are arranged within the housing, wherein the housing is sealed.

The possible advantages, embodiments or variants of the previous aspects of the invention are correspondingly applicable to the measuring head as well.

One advantage of the sealed housing and of the NV center arranged therein may reside in particular in the fact that protection of the NV center against liquids or gases, for instance, is made possible, whereby measuring with the measuring head can be simplified and/or made more reliable.

A fourth aspect of the invention relates to a system for detecting a nerve cell activity, wherein the nerve cell activity results in a magnetic field in an environment of the nerve cell. The system comprises a measuring head in accordance with the third aspect of the invention. Furthermore, the system comprises a light source for generating excitation light which has a temporally periodic modulation and by means of which the NV center of the measuring head is optically excitable, a sensor device configured to capture the emission light emitted by the NV center, and a control device. In this case, the lifetime and/or the occupation probability of at least one excited states of quantum states of the NV center are/is alterable by a strength and/or orientation of a magnetic field at the NV center. In addition, the control device is configured to cause the light source to irradiate the NV center with the temporally periodically modulated excitation light and, on the basis of the emission light captured by the sensor device, to determine a phase shift between the emission light and the modulation of the excitation light and also, on the basis thereof, to determine a measured value for the magnetic field at the NV center and thus, when the NV center is arranged in the environment of the nerve cell, to detect the nerve cell activity on the basis of the magnetic field on account of the nerve cell activity.

The possible advantages, embodiments or variants of the previous aspects of the invention are correspondingly applicable to the system as well. In this case, the system can be configured for instance to carry out a method in accordance with the first aspect of the invention.

In some variants, the system can advantageously be used in surgery—for instance in neurosurgery—and be configured accordingly for such a use. One advantage of the synergistic combination of the NV center and the determination of the measured value—i.e. for instance of the magnetic field and thus of the nerve cell activity—on the basis of determining the phase shift may result in particular in the fact that a high sensitivity for a possible nerve cell activity can be achieved, whereby in particular active nerve cells can be determined and injuring of active nerve cells—for instance on account of a cut, for instance by means of a scalpel—can be avoided or at least reduced.

Further advantages, features and application possibilities are evident from the following detailed description of embodiments and/or from the figures.

The invention is explained in greater detail below on the basis of advantageous embodiments with reference to the figures. Identical elements or component parts of the embodiments are identified substantially by identical reference signs, unless something to the contrary is described or unless something to the contrary is evident from the context.

DETAILED DESCRIPTION OF THE INVENTION

The figures are schematic illustrations of various embodiments and/or embodiments of the present invention. Elements and/or component parts illustrated in the figures are not necessarily illustrated as true to scale. Rather, the various elements and/or component parts illustrated in the figures are rendered in such a way that their function and/or their purpose become comprehensible to the person skilled in the art.

Connections and couplings between the functional units and elements as illustrated in the figures can also be implemented as indirect connections or couplings. In particular, data connections can be embodied as wired or wireless, that is to say in particular as radio connections. Moreover, certain connections, for instance electrical connections, for instance for supplying energy, may not be illustrated for the sake of clarity. Furthermore, optical connections, for instance between optical elements, which may be illustrated in particular as a straight light ray, can also be implemented, in some variants, by means of a light guide and/or by optical elements, such as mirrors, for deflecting light rays, such connections not necessarily being illustrated for the sake of clarity.

Figure 1:
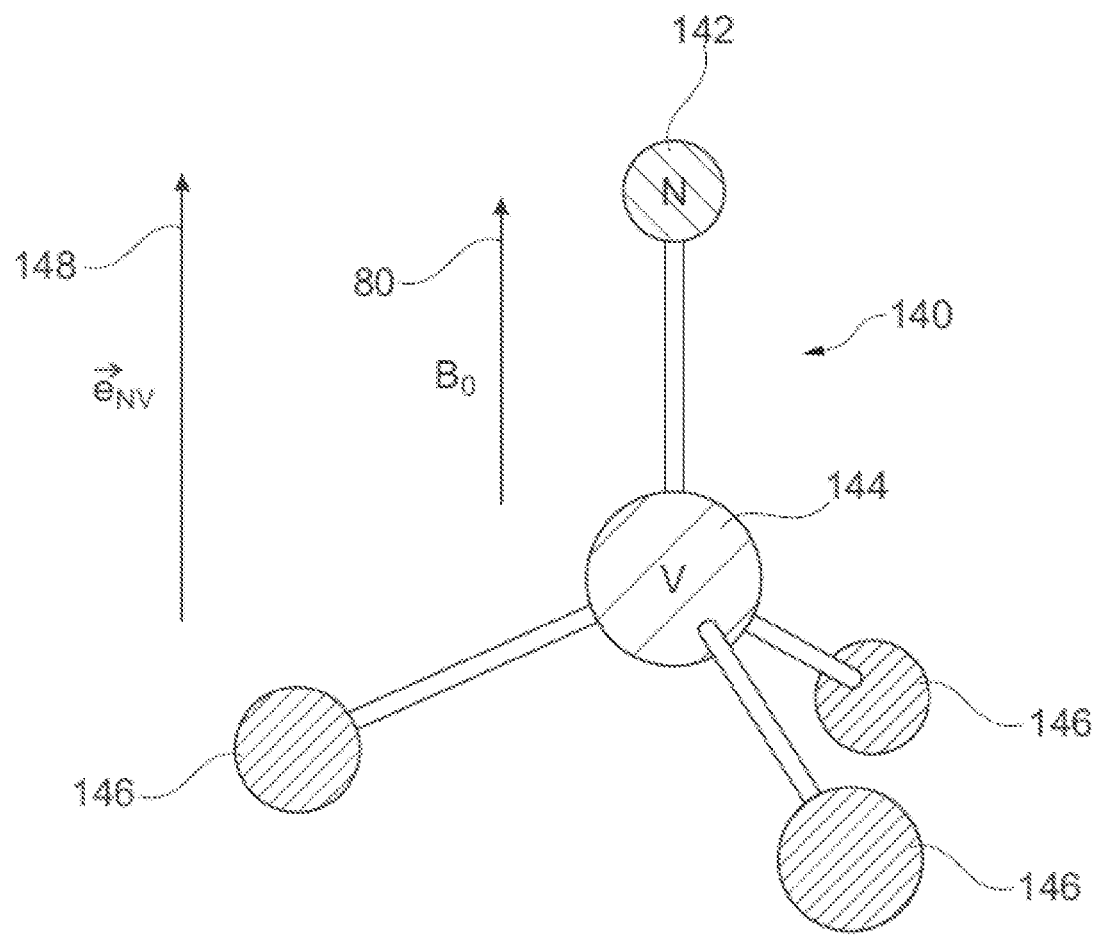
FIG. 1 shows a model of an [NV]− center.

FIG. 1 illustrates an atomic structure of an NV center such as a nitrogen-vacancy center, for instance, schematically by way of a ball and stick model of an [NV]⁻ center (140) without the surrounding diamond lattice. In this case, three carbon atoms 146 are arranged at three sites of the diamond lattice, while at a lattice site neighboring these three carbon atoms 146 (directly/nearest neighbor) there is a vacancy 144 (vacancy: V)—that is to say that this lattice site is not occupied—and arranged at a lattice site neighboring that (directly/nearest neighbor) there is a nitrogen atom 142 (nitrogen: N) instead of a carbon atom. Moreover, FIG. 1 illustrates a vector for an external magnetic field 80 and also an axis of the NV center 148—with respect to which axis a total spin of a multi-electron system of the NV center is defined. It goes without saying here that besides the external magnetic field 80 what is also effective is a magnetic field on account of the magnetic moments of the atomic nuclei on electrons of the multi-electron system or these magnetic fields are superposed, where—unless reference is made separately to these additional magnetic moments—within the meaning of the invention the "magnetic field effective there" should be understood to mean that magnetic field which occurs there, i.e. at the respective NV center, on account of the external magnetic field.

Figure 2:
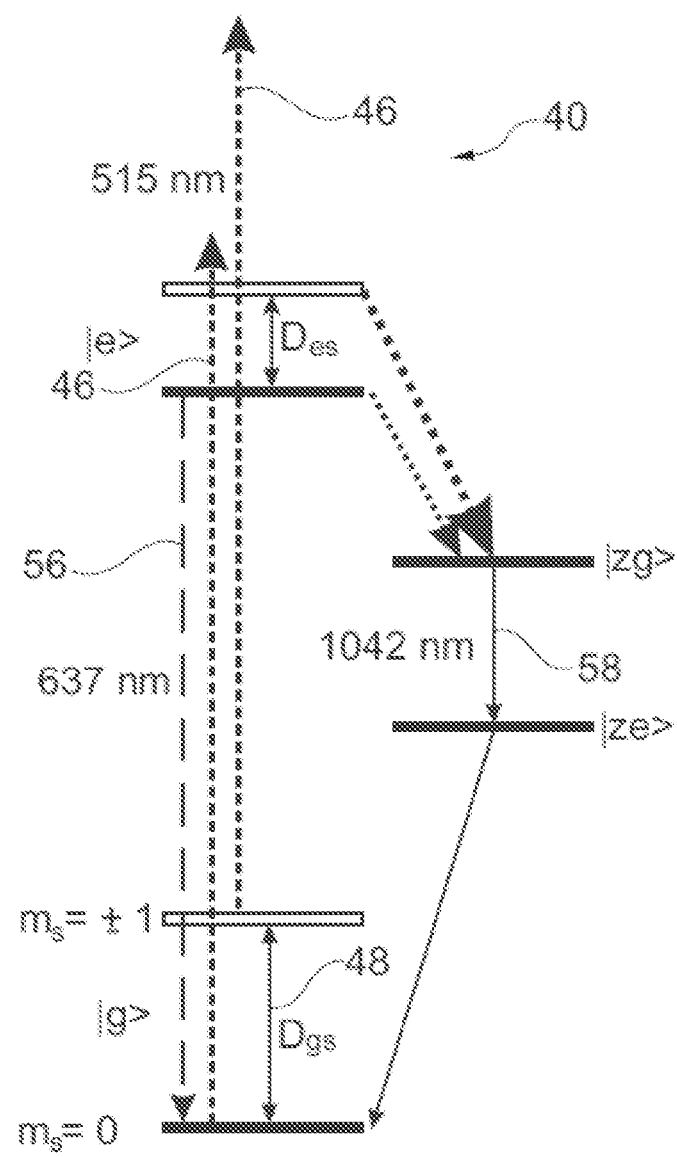
FIG. 2 shows an energy diagram for a NV center.

FIG. 2 illustrates an energy diagram 40 for an NV center such as, for instance, an [NV]⁻ center according to a current modeling (cf., for instance, Rogers, L. J.; Armstrong, S.; Sellars, M. J.; Manson, N. B. (2008). "Infrared emission of the NV center in diamond: Zeeman and uniaxial stress studies". New Journal of Physics. 10 (10): 103024.) (cf., for instance, Doherty, Marcus W.; Manson, Neil B.; Delaney, Paul; Jelezko, Fedor; Wrachtrup, Jörg; Hollenberg, Lloyd C. L. (Jul. 1, 2013). "The nitrogen-vacancy colour centre in diamond". Physics Reports. The nitrogen-vacancy colour centre in diamond. 528 (1): 1-45.). The multi-electron system of the NV center has a triplet ground state |g>, an excited triplet state |e> and also two intermediate states |ze> and |zg> lying energetically between the ground state |g> and the excited state |e>. Two of the electrons of the multi-electron system can be aligned parallel or antiparallel with regard to their spin in the triplet ground state, such that the multi-electron system has a total spin of +1 ($m_s$=+1) or −1 ($m_s$=−1) or a total spin of 0 ($m_s$=0). On account of their spin interaction, the electrons with spin +1 and −1 have a higher energy level than in the case of antiparallel alignment with Spin 0. In addition—not illustrated in FIG. 2—the energy levels for $m_s$=+1 and $m_s$=−1 can differ from one another for instance on account of an interaction with the magnetic moments of the atomic nuclei (cf. hyperfine structure), this splitting, i.e. a difference between the energy levels for $m_s$=+1 and $m_s$=−1, usually being significantly less than an energy difference between the energy levels for $m_s$=+1/ $m_s$=−1 relative to the energy level for $m_s$=0.

On the basis of FIG. 2, emission of emission light by an NV center 140 according to FIG. 1 and/or with regard to energy levels according to FIG. 2 and also a dependence of an intensity of the emission light on a resonant microwave absorption and possibly a magnetic field at the NV center can be elucidated as follows. By means of excitation light 46 having sufficient energy per photon, i.e. for instance a green laser having a wavelength of less than approximately 532 nm—such as, for instance, having a wavelength of 515 nm as illustrated—the [NV]⁻ center can be optically excited from the ground state |g> (firstly possibly into vibronic bands and then proceeding from there) into the excited state |e>, wherein the total spin of the multi-electron system is maintained, that is to say that, for instance, upon excitation of the ground state |g> where $m_s$=+1, what is correspondingly attained as the excited state is |e> where $m_s$=+1. Afterward, the NV center, with emission of a photon, i.e. emission light 56 and thus fluorescence, can return to the corresponding state of the triplet ground state—that is to say, for instance, from the excited state |e> where $m_s$=+1 to the ground state |g> where $m_s$=+1—; in this regard, for instance, in the case of an [NV]⁻ center, a photon at 637 nm, that is to say, for instance, red emission light 56, can be emitted. This transition is also called a radiative transition or optical transition, the (emission/fluorescence) light emitted in this case usually being optically detected.

Besides this radiative transition, a further transition via the intermediate states |ze> and |zg> is also possible, wherein for instance in the case of the transition of |zg> to |ze> a photon having a longer wavelength, that is to say, for instance, in the case of an [NV]⁻ center, a photon at 1042 nm, is emitted. Other models are based on only one intermediate state, and so no corresponding photon is emitted. In the case of these transitions, therefore, no emission of photons or at least an emission 58 of photons having a different wavelength, in particular having a longer wavelength, takes place, and these transitions are also called non-radiative transitions. In the case of these non-radiative transitions, the total spin of the multi-electron system is not necessarily maintained, the rate or the probability for a transition from an excited state where $m_s$=+1 or $m_s$=−1 of the excited triplet state |e> to the state where $m_s$=0 of the triplet ground state being greater than the rate or the probability for a transition from the excited state |e> where $m_s$=0 to one of the ground states where $m_s$=+1, 0 or −1. The further transition via the intermediate states |ze> and |zg> competes with the radiative transition. Consequently, an NV center, if it has a spin $m_s$=0, emits more emission light than in the case of a spin $m_s$=+1 or $m_s$=−1, since in the case of $m_s$=+1 or $m_s$=−1 a transition via the intermediate states takes place (comparatively) more frequently. Moreover, the lifetime of the excited states where $m_s$=+1 or $m_s$=−1 is shorter than the lifetime of the excited state |e> with total spin $m_s$=0. Moreover, in the case of an NV center, by means of repeated excitation, it is possible to increase the occupation probability for the ground state and/or for the excited state where $m_s$=0, since the ground state |g> where $m_s$=0 (and then after possibly renewed excitation the excited state |e> where $m_s$=0) is more probably attained via the further transition—this is also called spin polarization.

By means of specific measures—such as, for instance, radiation with a specific energy (in particular for each radiation quantum) corresponding to an energy difference between |g> where $m_s$=0 and |g> where $m_s$=±1 or corresponding to an energy difference between |e> where $m_s$=0 and |e> where $m_s$=±1—it is possible to increase the occupation probability for the ground state and/or the excited state where $m_s=+1$ or $-1$ in the case of an NV center. In the case of an [NV]⁻ center (without an external magnetic field), by means of microwave radiation 48 having a frequency of approximately 2870 MHz, a transition from the ground state |g> where $m_s=0$ to one of the ground states where $m_s=\pm 1$ can be resonantly excited, i.e. an electron spin resonance can be obtained—i.e. within the meaning of the disclosure in particular a resonant absorption of the (microwave) radiation by the NV center with transition from |g> where $m_s=0$ to |g> where $m_s=+1$ or $-1$. In the broader sense, an electron spin resonance can also be understood to mean such excitation with variation of the (external) magnetic field and measurement of the magnetic field-dependent absorption of the microwave radiation (cf. for instance https://de.wikipedia.org/wiki/Elektronenspinresonanz).

Applying an external magnetic field, in the case of an NV center in which the multi-electron system has a total spin ms with a first spin quantum number $m_s=0$, a second spin quantum number $m_s=+1$ and a third spin quantum number $m_s=-1$—such as, for instance, the [NV]⁻ center—, results in a shift in the energy levels of the ground state where $m_s=+1$ and of the ground state where $m_s=-1$ (the same correspondingly applies to the states of the excited triplet state |e> where $m_s=\pm 1$). Consequently, for the transition from |g> where $m_s=0$ to |g> where $m_s=-1$, a different frequency of the microwave radiation is required than for the transition from |g> where $m_s=0$ to |g> where $m_s=+1$, that is to say that, for instance, the electron spin resonance for $m_s=+1$ occurs at at least one resonant frequency and the electron spin resonance for $m_s=-1$ occurs at a further resonant frequency.

When an [NV]⁻ center is irradiated (initially without an external magnetic field) with microwave radiation having a frequency of approximately 2870 MHz, the probability for the states where $m_s=\pm 1$ is thus increased, as a result of which the fluorescence, i.e. the emitted emission light 56, and/or the lifetime of the excited triplet state |e> decrease(s)—for instance on account of the higher occupation probability for excited states where $m_s=\pm 1$, which have a shorter lifetime than the excited triplet state where $m_s=0$—. An external magnetic field 80 acting on the NV center 140 shifts in each case the frequency required for the electron spin resonance, as a result of which the probability for the states where $m_s=\pm 1$ is increased less or is no longer increased upon irradiation with microwave radiation having a frequency of approximately 2870 MHz and, consequently, the lifetime for the excited triplet state does not decrease or increases again and also a shortened lifetime occurs at the at least one resonant frequency and the further resonant frequency.

In the case of the NV center with a multi-electron system with a total spin with at least two spin quantum numbers, the lifetime of the excited triplet state |e> is thus at least dependent on the specific measure for increasing the occupation probability for states with one spin quantum number $m_s=\pm 1$—that is to say, for instance, the frequency and the field strength of the incident microwave radiation—, the excitation light—for instance on account of the spin polarization—and also on the (external) magnetic field effective at the NV center.

Moreover, the lifetime of at least one of the excited states of the NV center can be dependent on further variables such as, for instance, a material stress in a (for instance mesoscopic) solid-state element having the NV center or an electric field effective at the NV center, which are thus able to be measured as measured variables by way of the NV center as quantum sensor—i.e. in particular on the basis of the lifetime of |e> dependent thereon. Moreover, specific variables such as, for instance, a local state density in an environment of the NV center or a magnetic field—for instance a sufficiently strong magnetic field, for instance with at least 10 mT, and/or with an orientation which deviates from the axis 148 in such a way that said axis 148 no longer yields good quantum numbers for the total spin, that is to say that, for instance, the total spin with regard to said axis no longer represents eigenstates—can alter the occupation probabilities for the states where $m_s=-1, 0$, or +1 (for instance mix the states), such that the lifetime of the excited state is also dependent on such variables and the latter are determinable as measured variables by way of the lifetime.

In the case of an [NV]⁻ center, the lifetime of the excited state |e> (depending on the total spin) is typically in the range of from around 10 ns to a few ms.

Figure 3:
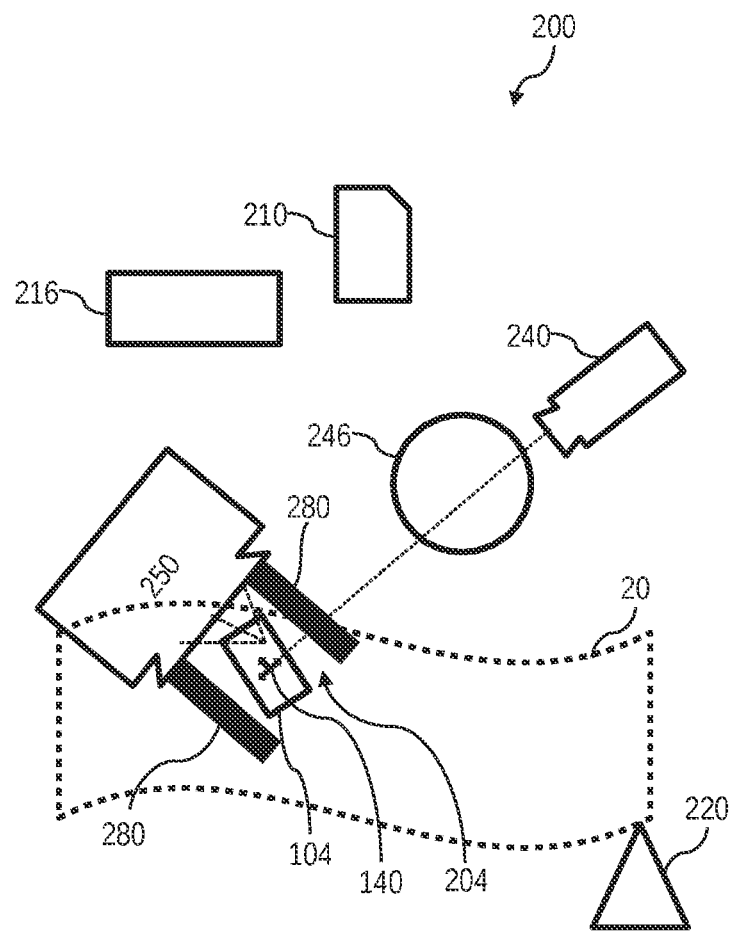
FIG. 3 shows a measuring apparatus according to one embodiment.

FIG. 3 schematically shows a measuring apparatus 200 for measuring a measured variable according to one embodiment of the present invention.

Moreover, FIG. 3 illustrates a material portion 20 to be examined on the basis of a measurement, which material portion does not necessarily belong to the apparatus 200. For one embodiment, the material portion 20 can be a metallic workpiece, for instance from a 3D printing method, a stamping method or a casting method.

In one embodiment, the measuring apparatus 200 comprises a sensor device 250 with a coil arrangement 280 arranged thereon and with a diamond platelet 104 arranged within the coil arrangement 280 or at least at one side for an emission light to be captured and also within a spatial region 204, the diamond platelet 104 having a plurality of NV centers 140 (only one NV center is illustrated, for the sake of clarity).

In some variants, the NV centers—as assumed for the following description—are in each case [NV]⁻ centers. Moreover, in some variants, the sensor device 250 comprises an image sensor, wherein the sensor device 250 is configured to capture the emission light of the NV centers 140 in an imaging manner and with a time resolution.

In the embodiment, the measuring apparatus 200 furthermore comprises a light source 240, for instance a laser apparatus 240, which is configured to generate a continuous excitation light, by means of which the NV centers 140 are optically excitable and thereupon emit the emission light—for instance magnetic field-dependently. In addition, the measuring apparatus 200 comprises an electro-optical modulator 246, wherein a beam path passes from the laser apparatus 250 to the NV centers 140 through the electro-optical modulator 246.

In the embodiment, the measuring apparatus 200 furthermore comprises a lock-in amplifier 216 and a control device 210. The control device 210 is configured to cause the light source 240 to continuously generate the excitation light. Furthermore, the control device 210 is configured to generate a modulation signal and thereby to control the electro-optical modulator 246, wherein the latter is configured to modulate an intensity of the excitation light depending on the modulation signal. In this regard, for instance, the modulation signal can have a sinusoidal profile or chirp profile or a rectangular or sawtooth profile and the intensity of the excitation light after passing through the electro-optical modulator 246 can correspondingly also have a sinusoidal profile, chirp profile etc. In this case, in some variants, the modulation signal consists of one or more frequencies in the range of between 10 kHz and 100 MHz, wherein for instance a rectangular profile or a sawtooth profile is a superposition of a plurality of sinusoidal profiles of different frequencies. In this case, the range of the frequencies—i.e. for instance the frequency range—is chosen such that the frequencies of the modulation are lower and thus the respective period duration is greater, in particular greater by at least a factor of 10, than the lifetime of the excited state of the NV centers—i.e. for instance greater than 10 ns. In addition, the time resolution during capturing by the sensor device 250 is higher than the respective period durations at least by a factor of 5.

Furthermore, the control device 210 is configured to determine a phase shift between the modulation of the excitation light and the emission light by means of the lock-in amplifier 216. In some variants, the control device 210 is configured to control the sensor device 250 by means of the lock-in amplifier 216 in such a way that said sensor device is sensitive to a determined phase shift. In addition, the control device 210 is configured to determine on the basis of the phase shift—possibly in an imaging manner for the respective positions of the NV centers 140—a measured value of the measured variable—i.e. for instance of a respective magnetic field at the respective NV center 140. In this regard, for instance, a sufficiently strong magnetic field can reduce the lifetime of the excited triplet state at the [NV]$^{--}$ center and thus reduce the phase shift.

In some alternative variants, the measuring apparatus 200 comprises a nanodiamond 104 having an NV center 140 instead of the diamond platelet. In this case, the nanodiamond 104 can be arranged in such a way within a material—for instance a liquid—or so close to a material—for instance the material portion 20—that the NV center 140 interacts with a local state density in the material and alters the occupation probabilities and/or lifetimes. In this regard, in some variants, for instance, a surface of the nanodiamond can be functionalized with a dye whose color—i.e. for instance a wavelength range absorbed by said dye—is dependent on its chemical environment. In this case, the lifetime of at least one excited state of the NV center can be shortened by way of a Förster resonance energy transfer and the phase shift can correspondingly be reduced if a wavelength of the emission light is in the wavelength range absorbed by the dye.

While some embodiments are described for instance with regard to [NV]$^-$ centers and the properties thereof—for instance a lifetime of the excited triple state that is dependent on the total spin—, other color centers can also be used as NV centers provided that these have at least one optically excitable state which—possibly besides other decay routes—decays with emission of emission light, wherein the lifetime of this at least one excited state or the excitability thereof—i.e. the occupation probability thereof upon radiation with excitation light—is dependent on a measured variable to be determined in each case. In this regard, for instance, a phase shift between the excitation light and the emission light can also result from a higher lifetime of a ground state—including upon excitation by excitation light.

In the embodiment, the control device 210 is additionally configured to generate, by means of the coil arrangement 280, a magnetic field for generating eddy currents in the material portion 20. In this case, the coil arrangement 280 can be configured to generate the magnetic field in such a way that the eddy currents occur at least substantially at different material depths that are variable by way of control on the part of the control device 210. In this case, the generated eddy currents and magnetic fields resulting therefrom—which are determined as measured variable—can enable conclusions to be drawn about a quality of the material portion 20. In this regard, for instance, a crack in the material portion would reduce the generated eddy currents.

In some variants of the embodiment, the measuring apparatus 200 comprises an actuator device 220, which is connectable to the material portion 20 in such a way that the actuator device 220 can alter a pose of the material portion 20 and/or move the material portion 20 along the sensor device 250 and the NV centers 140. In this case, the control device 210 can be configured to move the material portion 20 by means of the actuator device 220 and to arrange different regions of the material portion 20 at the sensor device 250 and/or the NV centers 140 and to determine the measured variable—i.e. for instance a magnetic field—at the respective region of the material portion 20.

Figure 4:
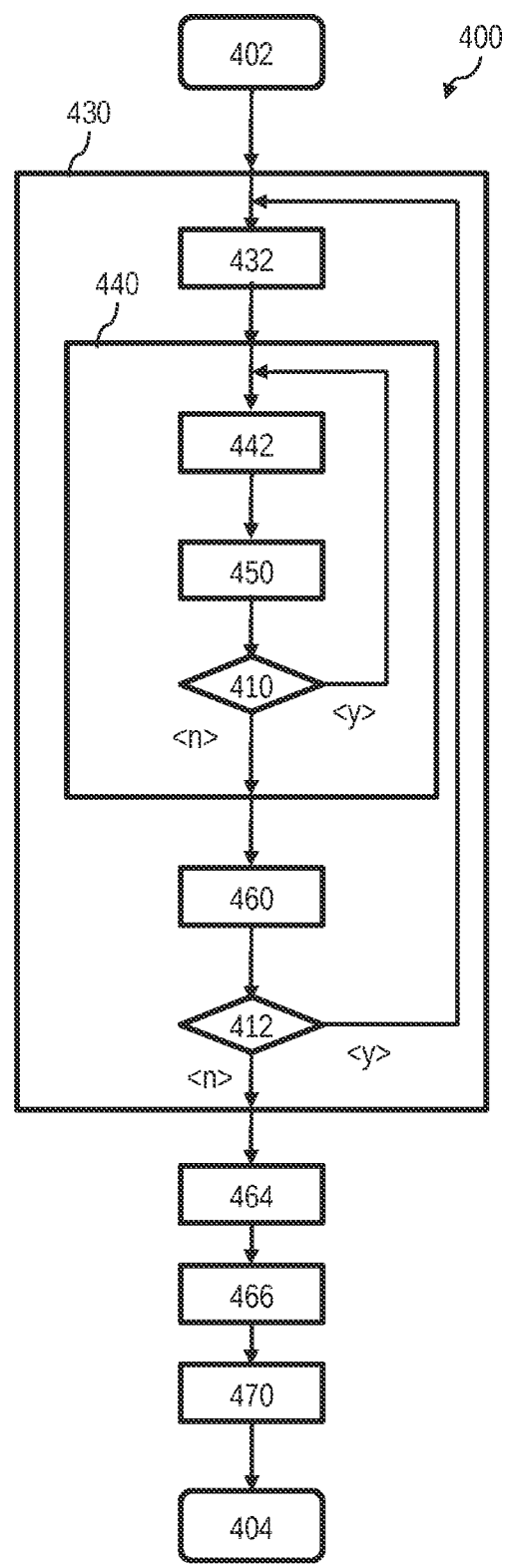
FIG. 4 shows a flow diagram of a measuring method according to one embodiment.

FIG. 4 shows a flow diagram of a measuring method 400 for measuring a measured variable on the basis of an NV center; the measuring method 400 according to one embodiment of the invention.

In one embodiment, the measuring method is based on an [NV]$^-$ center used as a quantum sensor, wherein in particular an (external) magnetic field acting at this NV center or at least the field strength of said magnetic field is determined as measured variable.

In one embodiment, the method 400 comprises the method steps 430, 432, 440, 442, 450, 460, 464, 466 and 470 and also the method conditions 410 and 412. The method 400 begins at the method start 402 and ends at the method end 404.

In the method step 430, the the [NV]$^-$ center is irradiated with a microwave radiation.

In this case, iteratively in the method step 432 (as part of the method step 430) a specific frequency is selected from a predetermined frequency range—for instance from 2.5 GHz to 3.2 GHz for the [NV]$^-$ center—and a microwave radiation having this respectively selected frequency is generated and radiated onto the [NV]$^-$ center.

At the respective frequency of the microwave radiation, the [NV]$^-$ center is irradiated with an excitation light in the method step 440.

In this case, iteratively in the method step 442 (as part of the method step 440) the excitation light is generated—for instance by a light source such as the light source 240 with regard to FIG. 3—, a value according to a sinusoidal profile being selected for the intensity of the excitation light. In this case, in some variants, the excitation light is firstly generated with an at least substantially constant intensity and is then attenuated according to the respectively selected value for the intensity—for instance by means of an acousto-optical modulator or by means of an electro-optical modulator such as, for instance, the electro-optical modulator 246 with regard to FIG. 3. Alternatively or additionally, the excitation light is already generated with an intensity corresponding to the respectively selected value—for instance by means of a laser diode whose supply with electrical energy is correspondingly modulated.

In addition, an intensity of the emission light of the NV center is time-dependently captured in the method step 450, wherein a time resolution of the time-dependent capturing is higher than a period duration of the sinusoidal profile. In this regard, for instance, for each selected value for the intensity of the excitation light, a plurality of intensities of the emission light are captured in a time profile, for instance in order to enable a resolution of a change in the intensity of the emission light in the case of a change in the intensity of the excitation light from a previously selected value to a value selected in a current iteration.

The method condition 410 involves checking whether even further values are to be selected for the intensity of the excitation light (in further iterations) (for the respective frequency of the microwave radiation). In this regard, the sinusoidal profile can be modeled for instance by way of a temporal profile of a multiplicity of discrete values—for instance so-called "samples"—and the sinusoidal profile can be repeated over a plurality of period durations. For a sinusoidal profile having a frequency of 10 MHz and accordingly a period duration of 1/(10 MHz)=100 ns, each period duration could be described by ten time-discrete values each having a length of 10 ns. Moreover, the sinusoidal profile could be repeated for 100 periods and thus over a total time of 100 us, for instance in order to enable a high accuracy when determining a phase shift. If even further values are to be selected—symbolized by <y>—the method 400 is continued at method step 442 and a further, temporally subsequent value is selected. Otherwise—symbolized by <n>—the method 400 is continued at method step 460.

In the method step 460, a phase shift between the intensity of the excitation light and the time-dependently captured intensity of the emission light is determined for the respective microwave frequency (that is to say for the respective frequency of the microwave radiation).

In this case, as explained above, the [NV]⁻ center comprises a multi-electron system having a triplet ground state |g> and an excited triplet state |e>, which for a total spin ms can each have the spin quantum numbers −1, 0 and +1, wherein in each case one of the quantum states of the triplet ground state can be excited in a spin-maintaining fashion optically—for instance by means of excitation light having a wavelength of 515 nm—to form a quantum state of the excited triplet state with the same total spin. In addition, the lifetime of the state |e> where $m_s$=0 as an at least one excited state with a first spin quantum number (namely 0) is higher than the lifetime of the state |e> where $m_s$=+1 as a second excited state with a second spin quantum number (namely +1) and also higher than the lifetime of the state |e> where $m_s$=−1 as a third excited state with a third spin quantum number (namely −1). In this case, the occupation probability for all three excited states of the excited triplet state |e> is dependent on the excitation light on account of the optical excitability. In addition, the ratio of the occupation probabilities for the quantum states of the triplet ground state |g> and of the excited triplet state |e> with a different total spin on account of the spin polarization is dependent on the excitation light and the duration and also intensity of the excitation light, a higher intensity and/or longer duration of the excitation light increasing the occupation probability for the states of |g> and |e> with the first spin quantum number, i.e. $m_s$=0 relative to states with the second or third spin quantum number, i.e. $m_s$=+1 or $m_s$=−1. By contrast, a sufficiently strong magnetic field or the microwave radiation in the case of a respective resonant microwave absorption dependent on the magnetic field respectively effective at the NV center causes an increase in the occupation probabilities for |g> where $m_s$=+1 or $m_s$=−1 and accordingly after optical excitation for |e> where $m_s$=+1 or $m_s$=−1. Since a sufficiently strong magnetic field or a resonant microwave absorption increases the occupation probabilities for excited states with a total spin equal to the second or third spin quantum number and these have a shorter lifetime, a total lifetime for the excited triplet state is correspondingly shortened, as a result of which the phase shift between the excitation light and the emission light is reduced. Consequently, the total spin of the multi-electron system can be read out on the basis of the determination of the phase shift, the total spin and the phase shift being dependent for instance on a magnetic field effective at the NV center and a resonant microwave absorption that possibly occurs.

The method condition 412 involves checking whether yet another microwave frequency in the predetermined frequency range is to be selected. If this is the case—symbolized by <y>—the method 400 is continued at method step 432 and the further microwave frequency is selected. Otherwise—symbolized by <n>—the measuring method 400 is continued at method step 464. In this regard, in some variants, the predetermined frequency range can be subdivided for instance into 200 subranges—possibly of equal widths—and a corresponding microwave frequency lying in the respective range can be selected for each of said subranges. In the case of variants in which, for each microwave frequency, the excitation light is temporally modulated and the emission light is captured over a total time of 100 us, varying the microwave radiation over the predetermined frequency range accordingly lasts 20 ms, whereby it is possible to achieve a frequency resolution regarding a change in the phase shift of approximately 25 Hz. In the case of nerve cells, a maximum rate of action potentials—for instance in the case of tetanus—is typically in the region of 120 Hz; nevertheless, a frequency resolution of 25 Hz is sufficient to detect a nerve cell activity. For applications requiring a higher frequency resolution, the predetermined frequency range can be reduced, the predetermined frequency range can be subdivided more coarsely and/or the total time for generating excitation light/time-dependently capturing emission light can be shortened. Moreover, the frequency of the sinusoidal profile can be increased.

The method steps 464 and 466 involve determining at least one resonant frequency at which a resonant microwave absorption occurs and a further resonant frequency at which a resonant microwave absorption occurs, on the basis of a change in the phase shift which was determined for each of the microwave frequencies. In some variants, in this case, in the method step 464, the at least one resonant frequency is determined as that frequency of the selected microwave frequencies at which the phase shift below 2.87 GHz becomes minimal. Accordingly, in some variants, in this case, in the method step 466, the further resonant frequency is determined as that frequency of the selected microwave frequencies at which the phase shift above 2.87 GHz becomes minimal.

The method step 470 involves determining the (external) magnetic field acting at the NV center or at least one magnetic field strength with regard to a spatial direction such as, for instance, the axis 148 on the basis of a frequency difference between the at least one resonant frequency and the further resonant frequency (and thus i.e. on the basis of the phase shift).

In some alternative variants, the magnetic field or its strength and also possibly the at least one resonant frequency and the further resonant frequency are determined by means of a numerical fit of a model describing the resonant microwave frequency and the phase shift as a function of an (external) magnetic field acting at the NV center and the frequency of the incident microwave radiation, wherein the method steps 464, 466 and 470 can be combined into a single method step 470.

Moreover, in some variants, the magnetic field or its strength is additionally determined on the basis of calibration data. In this regard, in some variants, the measuring method 400 can be carried out by means of a variant of the measuring apparatus 200 which additionally comprises a microwave antenna arrangement 130 for irradiating the NV center with the microwave radiation, wherein, in a further method step, by means of the coil arrangement 280, one or more (pre-) magnetizations are generated for calibration purposes, the method 400 is carried out in each case and the calibration data are thus determined.

Figure 5:
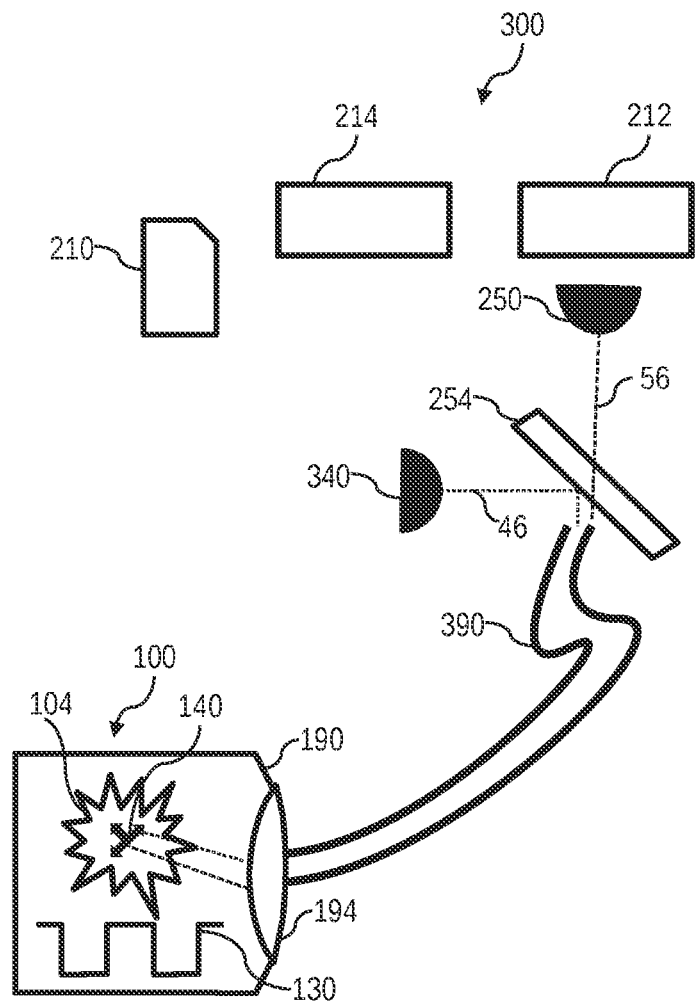
FIG. 5 shows a system for detecting a nerve activity using a measuring head according to one embodiment.

FIG. 5 illustrates a system 300 for detecting a nerve cell activity with a measuring head 100; the system 300 and the measuring head 100 each according to one embodiment of the invention.

In one embodiment, the system 300 comprises a control device 210, a mixer device 212, a bandpass filter 214, a laser diode 340 as light source for excitation light, a photodiode 250 as sensor device for emission light, a radiation splitter device 254 and—in some variants—a light guide 390 and also—in some variants—the measuring head 100. Alternatively, in some variants, the system 300 may not comprise the measuring head 100 and/or the light guide 390, wherein the measuring head 100 is able to be coupled to the system 300—for instance via a light guide.

The radiation splitter 254 is configured to split a beam path regarding the excitation light 46 and the emission light 56 in such a way that the excitation light 46 generated by the laser diode 340 is coupled into the light guide 390 and, conversely, an emission light 56 coming from the light guide 390—that is to say, for instance, light having a wavelength in the range around 637 nm—is guided to the photodiode 250, while a light coming from the light guide 390 at least with regard to a spectral range corresponding to that of the excitation light 46—that is to say lying for instance in the range around 515 nm—is not guided to the photodiode 250. In some variants, the radiation splitter device 254 is embodied as a dichroic mirror.

In one embodiment, the measuring head 100 comprises a housing 190, a nanodiamond or diamond, for instance macroscopic diamond, 104 having one NV center 140 or having a plurality of NV centers—for instance (each) an [NV]⁻ center—, a microwave antenna arrangement 130 and an optical coupling element 194. In some variants, the measuring head 100 comprises a plurality of nanodiamonds each having at least one NV center. In some further variants, the measuring head 100 comprises a macroscopic diamond, for instance a diamond platelet, having a plurality of NV centers. The (nano)diamond 104 and the microwave antenna arrangement 130 are arranged within the housing 190 and the optical coupling element 194 is arranged at an opening of the housing 190, the housing in interaction with the coupling element 194 being sealed in such a way that no liquids, biological cells or other materials such as, for instance, biological tissue, etc. can pass into the housing and/or out of the housing 190, as a result of which, firstly, disturbances on account of substances penetrating into the measuring head during the operation of the measuring head 100 can be avoided and, secondly, risks of infection resulting from the measuring head 100—for instance in the case of use for detecting nerve cell activities—can be reduced.

The optical coupling element 194 is mechanically connectable to the light guide 390 and is configured to irradiate the NV center 340 with the excitation light 46 generated by the laser diode 340 and guided through the light guide 390 and also to guide the emission light 56 emitted by the NV center to the light guide 390. In some variants, the light guide 390 has an electrical conductor for a microwave signal and the coupling element 194 is furthermore configured to electrically connect the electrical conductor to the microwave antenna arrangement 130 in such a way that the microwave antenna arrangement 130 can be supplied with the microwave signal via the electrical conductor. In this case, the microwave antenna arrangement 130, upon being supplied with a microwave signal, is configured to emit a microwave radiation and to irradiate the NV center 140 therewith. In addition, the control device 210 is configured to generate the microwave signal. One advantage of the light guide 390 and/or of the optical coupling element 194 may reside in particular in the fact that the excitation light 46 can be generated outside the measuring head 100 and the emission light 56 can be captured outside the measuring head 100, as a result of which the construction thereof can be simplified and the size thereof can be reduced. One advantage of the fact that the optical coupling element 194 and the light guide 390 are simultaneously configured for the excitation light and also for the emission light may reside in particular in the fact that only one light guide is required and a higher flexibility (compared with two separate light guides respectively for the excitation light and the emission light) is made possible, as a result of which, for instance, handling during neurosurgery can be simplified. In some modifications, the measuring head comprises the laser diode 340 and the photodiode 250 and also an electrical coupling element instead of the optical coupling element. In this case, the measuring head is connected to the (rest of the) system 300 by an electrical cable instead of the light guide. One advantage of the electrical cable compared with the light guide may reside in particular in the fact that the electrical cable is usually more flexible and/or less sensitive in the case of impacts or bends, as a result of which, for instance, handling in neurosurgery can be facilitated.

In some variants, the measuring head 100 has a volume which is less than 10 mm³, or is less than 5 mm³, or is less than 2 mm³.

In some variants, the measuring head 100 is designed for securing to a scalpel. Alternatively, in some variants, the measuring head comprises a scalpel; in this case, in some variants thereof, the NV center can be integrated in a blade of the scalpel.

In some variants, the measuring head 100 is designed for securing to a canula. Alternatively, in some variants, the measuring head comprises a canula; in this case, in some variants thereof, the NV center can be integrated at an opening of a canula.

In some variants, the housing 190 is reflectively coated on the inside in such a way that the emission light 56 emitted by the NV center 140 passes almost completely or at least to the extent of more than 50% to the optical coupling element 194 and via that into the light guide 390 and is guided to the photodiode 250.

The control device 210 is configured to cause the laser diode 340 to irradiate the NV center 140 with the temporally periodically modulated excitation light and, on the basis of the emission light captured by the photodiode 250, to determine a phase shift between the emission light 56 and the modulation of the excitation light 46 and also, on the basis thereof, to determine a measured value for the magnetic field at the NV center and thus, when the NV center 140 is arranged in an environment of a nerve cell, to detect a nerve cell activity of the nerve cell on the basis of the magnetic field. In this case, the control device 210 is configured to supply to the laser diode 340 with a correspondingly temporally periodically modulated electrical energy—for instance an electric current with a temporally periodic modulation. Furthermore, the control device 210 is configured, by means of the mixer device 212, to mix a sensor signal determined by the photodiode 250 and characterizing the emission light 56 with a mixing frequency, which, depending on homodyne or heterodyne operation, can be chosen to be at least substantially equal to a frequency of the modulation of the excitation light or at least a factor of 10 less, and thus to generate a superposition of the frequencies of the sensor signal with the mixing frequency. In addition, the control device 210 is configured to filter this superposition thus generated by means of the bandpass filter 214 and possibly to digitize that using an analog-to-digital converter. A signal-to-noise ratio can advantageously be increased by the mixer device 212 and the bandpass filter. By means of the microwave radiation and by varying the microwave frequency it is possible, by way of a resonant microwave absorption that occurs, to increase a sensitivity—even for weaker magnetic fields such as possibly below 10 mT—and possibly to obtain a sensitivity of 1 pT/(Hz^1/2).

In some variants, the system 300 is configured to carry out a variant of the measuring method 400 with regard to FIG. 4 in a manner controlled by means of the control device 210. Conversely, some variants of the measuring method 400 are carried out by a variant of the system 300, wherein for instance the excitation light 46 is generated by means of the laser diode 340, the emission light 56 is captured by means of the photodiode 250 and/or the microwave radiation is radiated onto the NV center 140 by means of the microwave antenna arrangement 130.

While some embodiments have been described with regard to one or more [NV]⁻ centers, the person skilled in the art can adapt these for further NV centers as well. In this regard, for instance, in some modifications with a so-called "hexagonal lattice site silicon vacancy ($V_{Si}$)", as excitation light a light having a wavelength of at most 861 nm, that is to say, for instance, an excitation light having a wavelength of 730 nm, is generated by a laser diode and as light from the spatial region or from the spatial portion respectively selected, that is to say in particular the emission light, is captured for a wavelength at least in the range of between 875 nm and 890 nm, and as microwave radiation a microwave radiation having a frequency in the range of 4.5 MHz is generated.

The following embodiments also arise with the above and/or are implemented by way of example with the above.

In some embodiments, the NV center has a multi-electron system having a total spin, wherein the quantum states of the NV center comprise a plurality of quantum states of the multi-electron system. The total spin of the multi-electron system in the at least one excited state has a first spin quantum number and the total spin in a second excited state of the multi-electron system has a second spin quantum number. The second excited state decays according to its lifetime with emission of the emission light, wherein the lifetime thereof differs from the lifetime of the at least one excited state. In this case, a ratio between the occupation probability for quantum states having the first spin quantum number and the occupation probability for quantum states having the second spin quantum number is dependent on the measured variable. In this advantageous way, it is possible to transform the measured variable to the total spin and to read out the total spin on account of the different lifetimes by way of the phase shift.

In some embodiments in which the NV center comprises a multi-electron system having a total spin, the excitation light increases the occupation probability for quantum states having the first spin quantum number relative to the occupation probability for quantum states having the second spin quantum number.

In some embodiments in which the NV center comprises a multi-electron system having a total spin, the measuring method furthermore comprises irradiating the NV center with a microwave radiation, the frequency of which is varied over a predetermined frequency range, wherein at at least one resonant frequency in the predetermined frequency range a resonant microwave absorption occurs at the NV center and the resonant microwave absorption increases the occupation probability for quantum states having the second spin quantum number relative to the occupation probability for quantum states having the first spin quantum number. In addition, the measuring method comprises determining the at least one resonant frequency on the basis of at least one change in the phase shift during the variation of the microwave radiation over the predetermined frequency range, wherein the measurement value is determined on the basis of the at least one resonant frequency.

In some embodiments in which the NV center is irradiated with microwave radiation and a resonant microwave absorption occurs, the measured variable is a magnetic field. In this case, at a further resonant frequency in the predetermined frequency range a resonant microwave absorption occurs at the NV center. In addition, the measuring method furthermore comprises determining the further resonant frequency on the basis of a further change in the phase shift during the variation of the microwave radiation over the predetermined frequency range, wherein the measured value is determined as the strength of the magnetic field at least on the basis of a shift in the frequency between the at least one resonant frequency and the further resonance frequency.

One advantage of determining the magnetic field or the strength thereof on the basis of the occurrence of the resonant microwave absorption may reside in particular in the fact that the total spin is manipulable in a targeted manner by way of the resonant microwave absorption and the microwave frequencies are variable with high accuracy, as a result of which it is possible to obtain a higher resolution and/or sensitivity for determining measured values for the magnetic field.

In some embodiments in which the NV center is irradiated with microwave radiation and a resonant microwave absorption occurs, the measured variable is an electric field or a material stress. In addition, the measured value is determined as the strength of the electric field or as the material stress value at least on the basis of a shift in the at least one resonant frequency relative to a fundamental resonant frequency at which the resonant microwave absorption occurs without an electric field or without a material stress. In this advantageous way, further measured variables (besides a magnetic field) can also be determined and the accuracy can be increased by way of the resonant microwave absorption.

In some embodiments in which the NV center is irradiated with microwave radiation and a resonant microwave absorption occurs, the NV center is irradiated continuously with the microwave radiation, wherein the variation of the microwave radiation is temporally slower than the modulation of the excitation light. In this advantageous way, it is possible to avoid disturbance as a result of pulsed microwave radiation and to determine the phase shift for each microwave frequency of the microwave radiation in a quasi-steady-state manner, which enables a simple measuring sequence and/or a reliable measurement.

In some embodiments, the measured variable is a magnetic field or a local state density in an environment of the NV center. In this case, the lifetime of the at least one excited state is dependent on the magnetic field or the local state density. In this advantageous way, the measuring method can be carried out without possible disturbance by microwave radiation and a corresponding measuring apparatus can be embodied in a simplified manner.

In some embodiments, the temporally periodic modulation of the excitation light comprises a temporally periodic modulation of the intensity of the excitation light. Furthermore, the measuring method comprises time-dependently capturing an intensity of the emission light of the NV center. In this case, the phase shift is determined on the basis of the temporally periodic modulation of the intensity of the excitation light and the time-dependently captured intensity of the emission light.

In some embodiments in which the temporally periodic modulation of the excitation light comprises a temporally periodic modulation of the intensity of the excitation light, the intensity of the excitation light is temporally periodically modulated by means of an acousto-optical modulator or by means of an electro-optical modulator. In this advantageous way, a light source for the excitation light can be operated continuously, as a result of which it is possible to obtain a higher stability of the intensity or of the amplitude of the intensity of the excitation light radiated onto the NV center.

In some embodiments in which the temporally periodic modulation of the excitation light comprises a temporally periodic modulation of the intensity of the excitation light, the excitation light is generated by means of a laser apparatus and the intensity of the excitation light is temporally periodically modulated directly by means of a supply of energy to the laser apparatus. In this advantageous way, an efficient construction of a corresponding measuring apparatus can be made possible and/or high modulation frequencies and/or intensity amplitudes can be obtained in the measuring method.

In some embodiments in which the temporally periodic modulation of the excitation light comprises a temporally periodic modulation of the intensity of the excitation light, the temporally periodic modulation of the intensity of the excitation light corresponds to a sinusoidal profile. A superposition of a plurality of sinusoidal profiles of different frequencies is also possible and can contribute for instance to improving the signal.

In some embodiments, the temporally periodic modulation has frequency components in the range of between 5 kHz and 700 MHz.

In some embodiments, the (measuring) apparatus furthermore comprises a bandpass filter and is configured to filter a sensor signal determined by the sensor device and characterizing the emission light by means of the bandpass filter.

In some embodiments, the (measuring) apparatus furthermore comprises a lock-in amplifier and is configured to determine the phase shift by means of the lock-in amplifier on the basis of a sensor signal determined by the sensor device and characterizing the emission light.

While embodiments, application possibilities and application examples have been described in detail in particular with reference to the figures, it should be pointed out that a large number of modifications are possible. Moreover, it should be pointed out that the embodiments and applications are merely examples that are not intended to restrict the scope of protection, the application and the set-up in any way. Rather, the preceding description gives the person skilled in the art a guideline for the implementation and/or application of at least one embodiment, wherein diverse modifications, in particular alternative or additional features and/or modifications of the function and/or arrangements of the constituent parts described, can be made as desired by the person skilled in the art, without in so doing departing from the subject matter—and the legal equivalents thereof— respectively defined in the appended claims and/or without leaving their scope of protection.

What is claimed is:

1. A measuring method for measuring a measured variable on the basis of an NV center which has a plurality of quantum states and is also optically excitable into at least one excited state of the quantum states by means of an excitation light depending on an occupation of one of the quantum states, wherein the at least one excited state decays with emission of emission light of the NV center, wherein the measuring method comprises:
   irradiating the NV center with the excitation light, wherein the excitation light has a temporally periodic modulation and wherein a respective occupation probability and/or a respective lifetime of the quantum states are/is dependent on the measured variable and the excitation light;
   determining a phase shift between the emission light of the NV center and the modulation of the excitation light; and
   determining a measured value for the measured variable on the basis of the phase shift.

2. An apparatus for measuring a measured variable, comprising:
   a spatial region for arranging one or more NV centers;
   a light source for irradiating the spatial region with an excitation light which has a temporally periodic modulation and by means of which, when the one or more NV centers are arranged within the spatial region, one or more of the NV centers are optically excitable;
   a sensor device configured to capture an emission light emitted by one or more of the NV centers; and
   a control device configured to cause the light source to irradiate at least one of the NV centers with the temporally periodically modulated excitation light and, on the basis of the emission light captured by the sensor device, to determine a phase shift between the emission light and the modulation of the excitation light and also, on the basis thereof, to determine a measured value for the measured variable in the case of the at least one NV center.

3. A measuring head for a measurement of a measured variable, wherein the measuring head comprises:
   a housing,
   an NV center,
   a light source configured to irradiate the NV center with an excitation light generated by the light source, or an optical coupling element, which is connectable to a light guide arranged outside the housing and is configured to irradiate the NV center with an excitation light radiated in via the light guide; and
   a sensor device configured to capture an emission light emitted by the NV center, or an optical coupling element configured to guide the emission light emitted by the NV center to a light guide arranged outside the housing;
   and wherein the NV center and also possibly the sensor device or possibly the light source are arranged within the housing and the housing is sealed.

4. The measuring method as claimed in claim 1, wherein a diamond has a nitrogen-vacancy center as the NV center.

5. The measuring method as claimed in claim 1, wherein:
   the NV center has a multi-electron system having a total spin$_s$ and the quantum states of the NV center comprise a plurality of quantum states of the multi-electron system;
   the total spin of the multi-electron system in the at least one excited state has a first spin quantum number and the total spin in a second excited state of the multi-electron systems has a second spin quantum number;

the second excited state decays according to its lifetime with emission of the emission light, wherein the lifetime thereof differs from the lifetime of the at least one excited state; and a ratio between the occupation probability for quantum states having the first spin quantum number and the occupation probability for quantum states having the second spin quantum number is dependent on the measured variable.

6. The measuring method as claimed in claim 5, wherein the excitation light increases the occupation probability for quantum states having the first spin quantum number relative to the occupation probability for quantum states having the second spin quantum number.

7. The measuring method as claimed in claim 5, wherein the measuring method furthermore comprises:

irradiating the NV center with a microwave radiation, the frequency of which is varied over a predetermined frequency range, wherein at at least one resonant frequency in the predetermined frequency range a resonant microwave absorption occurs at the NV center and the resonant microwave absorption increases the occupation probability for quantum states having the second spin quantum number relative to the occupation probability for quantum states having the first spin quantum number; and determining the at least one resonant frequency on the basis of at least one change in the phase shift during the variation of the microwave radiation over the predetermined frequency range, wherein the measured value is determined on the basis of the at least one resonant frequency.

8. The measuring method as claimed in claim 7, wherein:
the measured variable is a magnetic field; and
at a further resonant frequency in the predetermined frequency range a resonant microwave absorption occurs at the NV center;
and wherein the measuring method furthermore comprises:
determining the further resonant frequency on the basis of a further change in the phase shift during the variation of the microwave radiation over the predetermined frequency range, wherein the measured value is determined as the strength of the magnetic field at least on the basis of a frequency difference between the at least one resonant frequency and the further resonant frequency.

9. The measuring method as claimed in claim 7, wherein:
the measured variable is an electric field or a material stress; and
the measured value is determined as the strength of the electric field or as the material stress value at least on the basis of a shift in the at least one resonant frequency relative to a fundamental resonant frequency at which the resonant microwave absorption occurs without an electric field or without a material stress.

10. The measuring method as claimed in claim 7, wherein the NV center is irradiated continuously with the microwave radiation and the variation of the microwave radiation is temporally slower than the modulation of the excitation light.

11. The measuring method as claimed in claim 1, wherein:
the measured variable is a magnetic field or a local state density in an environment of the NV center; and
the lifetime of the at least one excited state is dependent on the magnetic field or the local state density.

12. The measuring method as claimed in claim 1:
wherein the temporally periodic modulation of the excitation light comprises a temporally periodic modulation of the intensity of the excitation light;
wherein the measuring method furthermore comprises:
time-dependently capturing an intensity of the emission light of the NV center;
and wherein the phase shift is determined on the basis of the temporally periodic modulation of the intensity of the excitation light and the time-dependently captured intensity of the emission light.

13. The measuring method as claimed in claim 12, wherein the intensity of the excitation light is temporally periodically modulated by means of an acousto-optical modulator or by means of an electro-optical modulator.

14. The measuring method as claimed in claim 12, wherein the excitation light is generated by means of a laser apparatus and the intensity of the excitation light is temporally periodically modulated directly by means of a supply of energy to the laser apparatus.

15. The measuring method as claimed in claim 12, wherein the temporally periodic modulation of the intensity of the excitation light corresponds to a sinusoidal profile.

16. The measuring method as claimed in claim 1, wherein the temporally periodic modulation has frequency components in the range of between 5 kHz and 700 MHz.

17. The apparatus as claimed in claim 2, which furthermore comprises a lock-in amplifier and a bandpass filter and is configured to filter a sensor signal determined by the sensor device, said sensor signal characterizing the emission light, by means of the bandpass filter and to determine the phase shift by means of the lock-in amplifier.

18. A system for detecting a nerve cell activity, comprising:
a measuring head as claimed in claim 17;
a light source for generating excitation light which has a temporally periodic modulation and by means of which the NV center of the measuring head is optically excitable;
a sensor device configured to capture the emission light emitted by the NV center; and
a control device;
where:
the nerve cell activity results in a magnetic field in an environment of the nerve cell;
the lifetime and/or the occupation probability of at least one excited state of quantum states of the NV center are/is alterable by a strength and/or orientation of a magnetic field at the NV center; and
the control device is configured to cause the light source to irradiate the NV center with the temporally periodically modulated excitation light and, on the basis of the emission light captured by the sensor device, to determine a phase shift between the emission light and the modulation of the excitation light and also, on the basis thereof, to determine a measured value for the magnetic field at the NV center and thus, when the NV center is arranged in the environment of the nerve cell, to detect the nerve cell activity on the basis of the magnetic field on account of the nerve cell activity.

* * * * *